United States Patent [19]
Zhou et al.

[11] Patent Number: 6,094,667
[45] Date of Patent: Jul. 25, 2000

[54] TIME SPREAD ROOT NYQUIST FILTER

[75] Inventors: Xuping Zhou; Changming Zhou; Guoliang Shou, all of Tokyo, Japan

[73] Assignee: Yozan Inc., Tokyo, Japan

[21] Appl. No.: 09/003,507

[22] Filed: Jan. 6, 1998

[30]    Foreign Application Priority Data

Jan. 7, 1997  [JP]  Japan ................................... 9-011953

[51] Int. Cl.[7] ............................ G06F 17/10; H04L 27/00
[52] U.S. Cl. ............................ 708/321; 708/300; 375/259
[58] Field of Search ................................... 708/321, 300; 375/259, 285

[56]           References Cited

U.S. PATENT DOCUMENTS 4,720,839  1/1988  Feher et al. .............................. 375/285
5,103,295  4/1992  Uwabata et al. ......................... 348/556
5,263,053  11/1993  Wan et al. ............................... 375/285

*Primary Examiner*—Tan V. Mai
*Attorney, Agent, or Firm*—Pillsbury Madison & Sutro LLP

[57]            ABSTRACT

In a method is disclosed for transmitting and receiving a transmission data signal, after the transmission data signal is generated, it is modulated by a first time spread root Nyquist filter to generate a transmission signal. The signal is then transmitted and received, whereupon the signal is transformed into a baseband signal. The baseband signal is then demodulated through a second time spread root Nyquist filter to revive the transmission data signal. An apparatus is also disclosed that performs this method. In addition, methods of separately transmitting and receiving signals are also described.

16 Claims, 4 Drawing Sheets

Amplitude-Frequency Characteristics

Phase-Frequency Characteristics

Output Signal Passed Through Once

Output Signal Passed Through Twice

Output Signal of Conventional Root Nyquist Filter

Output Signal of Time Spread Root Nyquist Filter

TIME SPREAD ROOT NYQUIST FILTER

FIELD OF THE INVENTION

The present invention relates to a root Nyquist filter, in particular, one adaptable to wireless communication systems.

BACKGROUND OF THE INVENTION

Conventionally, a data transmission system employs a Nyquist filter whose reply for an impulse is zero (0) for every interval T just before and after a peak (T: data transmission interval). As replies of adjacent data are zero on a sample point of other sampled data, interference between codes can be prevented.

To function as above, a Nyquist filter whose amplitude becomes half at the point where Nyquist frequency $f_N$ (=1/2T) is used, and it is odd-symmetrically rolled off with a squared cosine around the half amplitude point in the cutoff area. In this case the phase characteristics is not considered, or is designed to have linear phase characteristics usually.

Instead of a simple Nyquist filter, low-pass filters (root Nyquist filters) having equal amplitude are set for transmission and reception and their characteristics are made the same as that of the Nyquist filter above. In this case, the root Nyquist filter must have cosine characteristics that can be made the squared cosine characteristics above.

SUMMARY OF THE INVENTION

As above, the phase characteristics of conventional root Nyquist filters are not regulated, or only regulated to have a total linear phase. Therefore, when the transmission signal input to the root Nyquist filter at transmission has a high peak, a signal having approximately the same peak is output from the root Nyquist filter in reception. As the output from the root Nyquist filter at transmission is input to a modulator or a high-frequency amplifier, the characteristics of that modulator or high-frequency amplifier are strictly requested in a data transmission system for receiving high-peak signals. Consequently, a small peak factor (peak transmission power/mean transmission power) of the transmission signal is requested.

Since the root Nyquist filter at reception also has similar characteristics, impulse noise generated along the transmission route is input to the modulating portion as it is through the root Nyquist filter at reception, which causes reception errors.

The present invention solves these problems and has an object to provide a root Nyquist filter for decreasing the peak factor in a transmitter and suppressing impulse noise.

To achieve the above object, a root Nyquist filter according to the present invention is set for transmission or reception in a data transmission system, wherein its phase frequency characteristics divide the passband into a plurality of frequency bands, to make a correspondence with each component of pseudo noise having a length corresponding to the divided number of frequency band and the plurality of frequency bands, and each frequency band has a phase corresponding to a value of each component of the pseudo noise.

As the phase frequency characteristics are of the pseudo noise type, the output of the time spread root Nyquist filter according to the present invention has a lower peak and a longer response time than that having conventional linear phase characteristics. The output signal passed twice through the time spread root Nyquist filter is the same as that of the conventional root Nyquist filter.

BRIEF DESCRIPTION OF THE DRAWINGS

FIG. 1 (b) shows the phase frequency characteristics of a time spread root Nyquist filter transfer function.

PREFERRED EMBODIMENT OF THE PRESENT INVENTION

Figure 1:
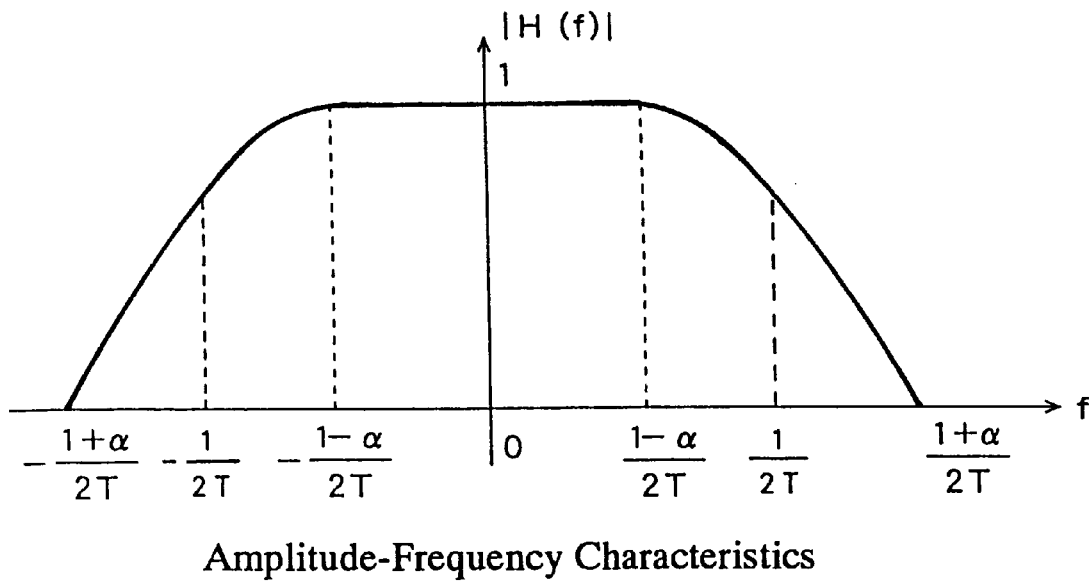
FIG. 1 (a) shows the amplitude frequency characteristics of a time spread root Nyquist filter transfer function.
Figure 1:
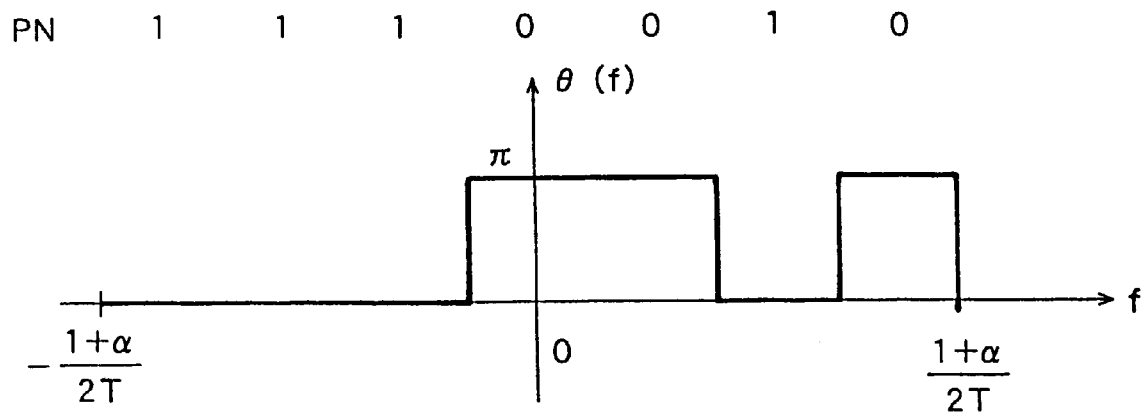

FIG. 1 (a) shows exemplary amplitude-frequency characteristics of the time spread root Nyquist filter of the present invention. This example shows the case where the total characteristics of two Nyquist filters at transmission and reception is the squared cosine. The amplitude-frequency characteristics of the single root Nyquist filter shown in FIG. 1(a) has the cosine rolloff characteristics shown by formula (1):

$$|H(f)| = \begin{cases} 1 & 0 \le |f| < (1-\alpha)/2T \\ \cos[(T/4\alpha)(2\pi|f| - \pi(1-\alpha)/T] & (1-\alpha)/2T \le |f| < (1+\alpha)/2T \\ 0 & (1+\alpha)/2T \le |f| \end{cases} \quad (1)$$

The amplitude-frequency characteristics are the same as those of the conventional root Nyquist filter.

FIG. 1 (b) shows exemplary phase-frequency characteristics of the time spread root Nyquist filter of the present invention. As shown, in the time spread root Nyquist filter of the present invention, the area with the amplitude characteristics excepting zero (0) ("passband", hereinafter) is divided into a predetermined number (7, in this example) and given a phase corresponding to the bit at the location in response to the pseudo noise code ("1, 1, 1, 0, 0, 1, 0", in this example) having the length according to the predetermined number 7. That is, M code with the length 7 is selected as the pseudo noise code (PN code), and the 7-bit PN code is corresponded to each frequency band whose time spread root Nyquist filter passband is equally divided into 7. The frequency band phase corresponding to PN code bit "1" is 0, and that corresponding to "0" is π. For example, a digital filter can provide such a phase.

The description above is not limited to an M code with a length of 7: any PN code length can be adopted. When the PN code is long, the circuit is large owing to the increase of digital filter taps. Instead of PN codes, codes having good self-correlation characteristics can similarly be used.

Figure 2:
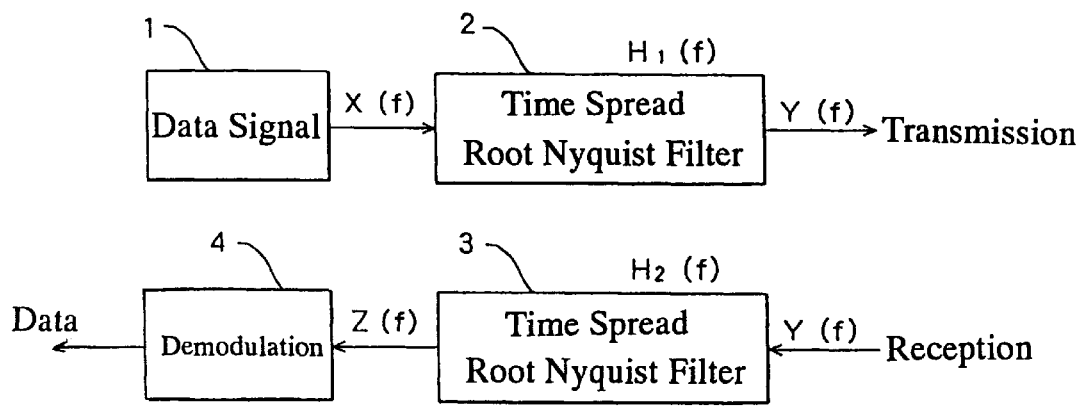
FIG. 2 shows a diagram for explaining the communication system using a root Nyquist filter.

FIG. 2 shows the main structure of a communication system using time spread root Nyquist filters of the present invention having such characteristics.

In FIG. 2, 1 is a transmission data source, from which the output transmission data signal is input to root Nyquist filter 2 at transmission. The data is modulated through 2 and made a transmission signal with a predetermined frequency band in a modulator (not shown), then amplified by a high-frequency amplifier (not shown) for transmission to the receiving part.

The transmitted signal is sent to the receiving part, transformed into a baseband signal through a frequency transforming portion (not shown), and input to root Nyquist filter 3 at reception. The signal received through root Nyquist filter 3 is demodulated in information demodulating portion 4, and the original transmission data is revived.

The transfer function $H_1(f)$ of time spread root Nyquist filter 2 in the transmission part above is expressed by formula (2):

$$H_1(f)=|H(f)|e^{j\theta(f)} \quad (2)$$

The transfer function $H_2(f)$ of time spread root Nyquist filter 3 has a phase characteristics polarity different from 2 as expressed by formula (3):

$$H_2(f)=H^*_1(f)=|H(f)|e^{-j\theta(f)} \quad (3)$$

As shown in FIG. 1, when the PN code is binary and "0" and "1" are replaced by phases 0 and $\pi$, respectively, formula (4) is true:

$$e^{j\theta(f)}=e^{-j\theta(f)} \quad (4)$$

Therefore, formulas (5) and (6) are also true:

$$H(f)=H^*(f) \quad (5)$$

$$H_2(f)=H_1(f) \quad (6)$$

This means that 2 can also be used as 3 in this case.

When the data signal output from data signal source 1 is $X(f)$, transmission signal $Y(f)$ output from 2 at transmission is shown by (7):

$$Y(f)=X(f)H_1(f) \quad (7)$$

Signal $Y(f)$ is received by a receiver and input to 3. The output $Z(f)$ is expressed by formula (8):

$$Z(f)=Y(f)H_2(f)=X(f)H_1(f)H^*_1(f)=X(f)|H(f)|^2 \quad (8)$$

That is, the response is identical to the case using the usual root Nyquist filter.

It is common knowledge that when a filter has amplitude-frequency characteristics and phase-frequency characteristics $H(f)$ and $\theta(f)$, respectively, and receives signal $s(t)$, its output is the sum of all frequencies f after multiplying the amplitude of f by $s(t)$ and $H(f)$, and moving the phase of the multiplied value by $\theta(f)$. As mentioned, passing through the filter with phase-frequency characteristics corresponding to the pseudo noise, each frequency component of the input signal is moved by the corresponding phase and added. Therefore, the time spread root Nyquist filter of the present invention has a lower peak and longer corresponding time than conventional root Nyquist filters having linear phase frequency characteristics.

Figure 3:
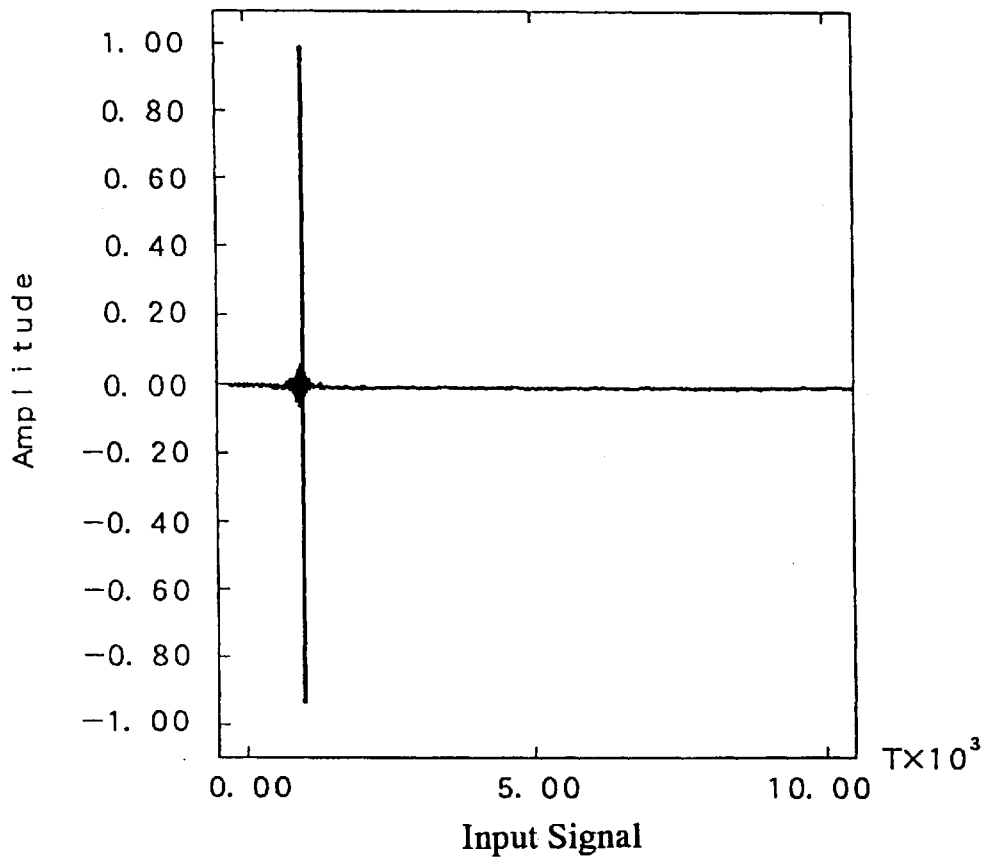
FIG. 3 shows an exemplary signal to be input to a root Nyquist filter.
Figure 4:
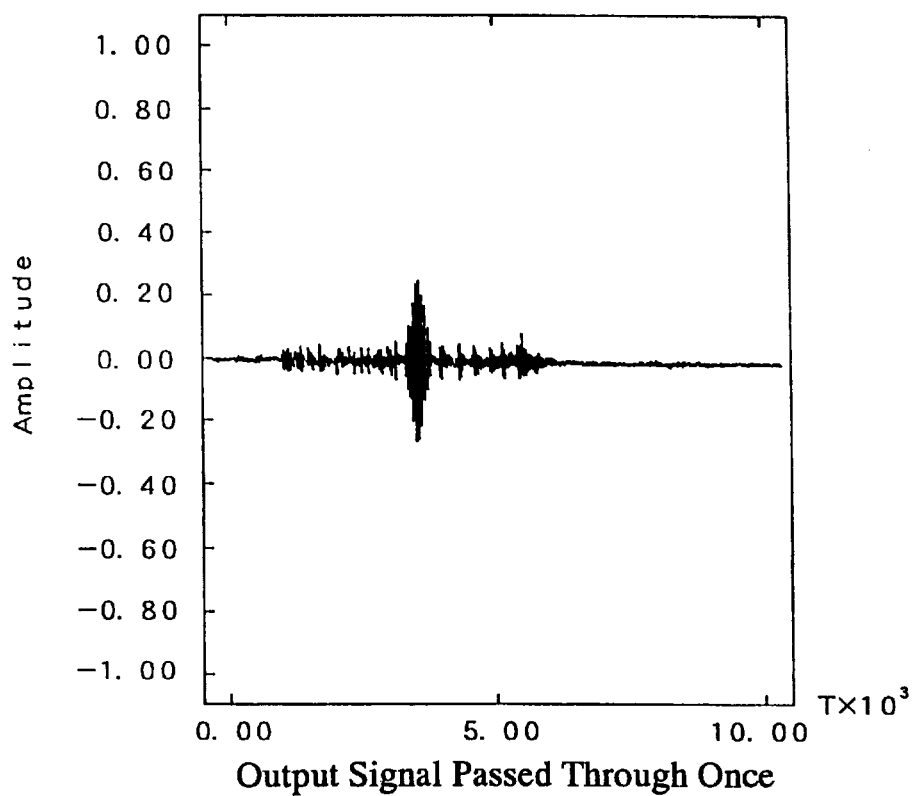
FIG. 4 shows an output signal after the input signal in FIG. 3 has passed once through the present time spread root Nyquist filter.

FIG. 3 shows an exemplary input signal for the time spread root Nyquist filter, and FIG. 4 shows the waveform of an output signal from the time spread root Nyquist filter according to the present invention. When a signal having a short period and a high peak such as shown in FIG. 3 is input, a signal having a low peak and continuous long time as shown in FIG. 4 is output from the present time spread root Nyquist filter. When a conventional filter having linear phase-frequency characteristics receives the input signal in FIG. 3, it outputs the signal as it is with the predetermined time delay (the time corresponding to the phase-frequency characteristics inclination). In this way, when the time spread root Nyquist filter of the present invention is used, the transmission signal peak factor is decreased.

Figure 5:
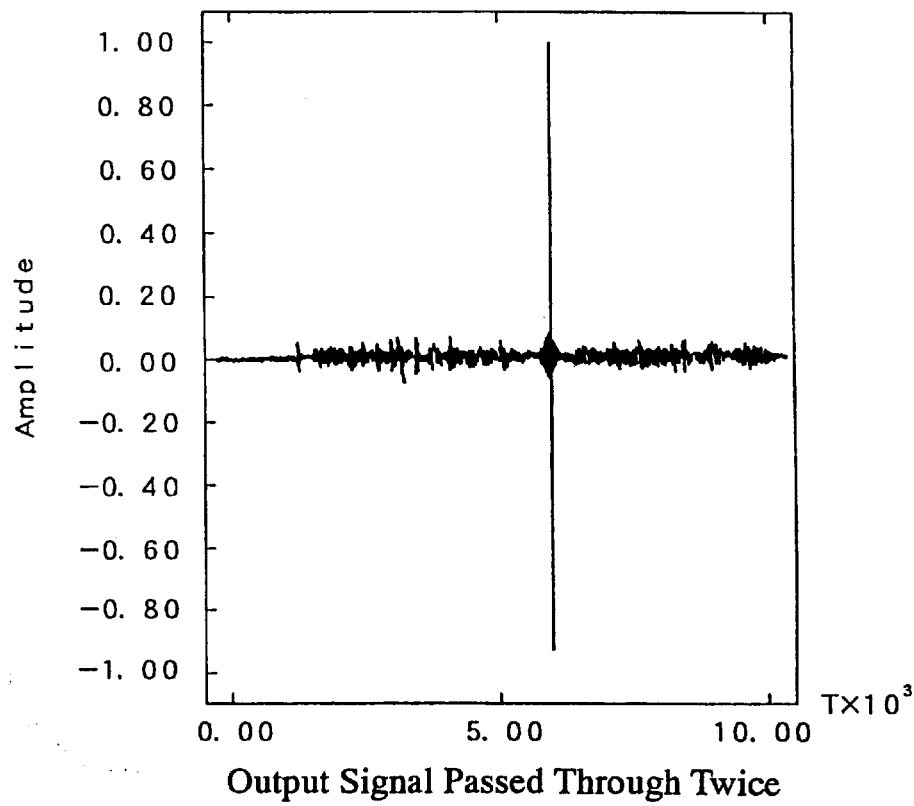
FIG. 5 shows an output signal after the input signal in FIG. 3 has passed twice through the present time spread root Nyquist filter.

The pulse signal in FIG. 4 passed through the time spread root Nyquist filter 2 at transmission is received by a receiver through a transmission route and input to time spread root Nyquist filter 3 at reception. FIG. 5 shows the output of 3. The signal shown in FIG. 5 is the output of the impulse signal in FIG. 3 passed twice through the present time spread root Nyquist filter. As is shown in FIG. 5, the output signal is similar to the impulse signal in FIG. 3. That is, each frequency band signal component with a different delay time owing to the phase frequency characteristics above passes through the time spread root Nyquist filter again, and each has a different phase once again; finally, all passband signal components have the same phases, and the output signal with the predetermined delay time from the impulse signal in FIG. 3 is obtained.

Using the time spread root Nyquist filter of the present invention makes it possible to transmit an input signal while suppressing its peak, as well as reproduce the input signal at reception. Therefore, the peak factor of a signal input to a modulator and a high-frequency amplifier can be decreased at transmission; consequently, this modulator and high-frequency amplifier can be simplified. Also, it is possible to provide a transmission system that does not reflect the non-linear characteristics of modulator and high-frequency amplifier.

Figure 6:
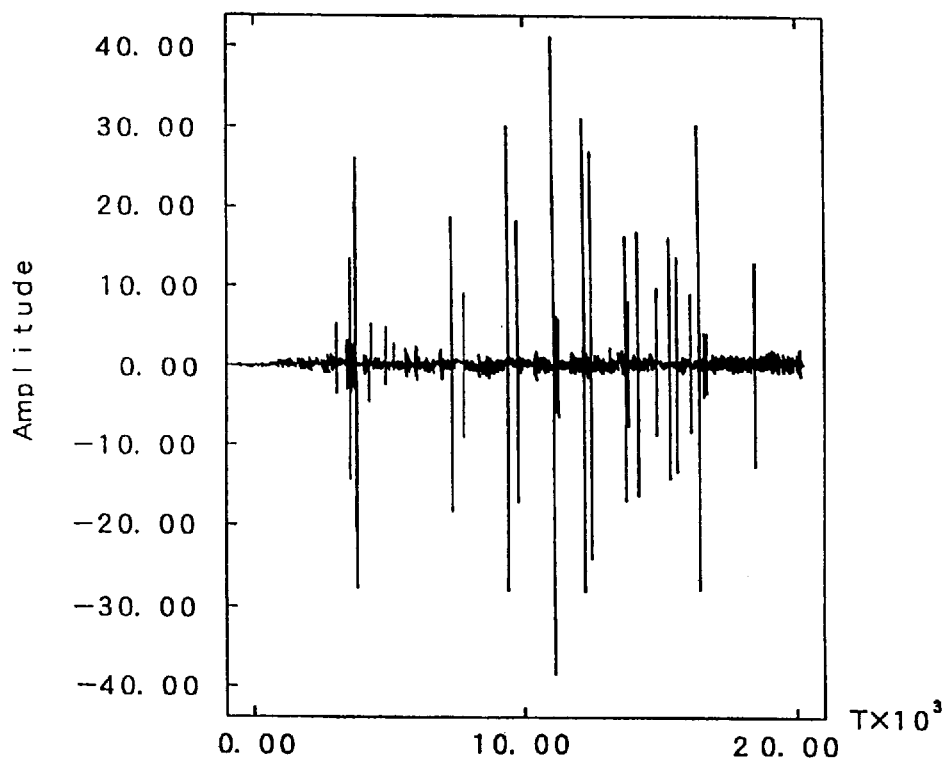
FIG. 6 shows an output signal of the conventional root Nyquist filter when the amplitude inputs the impulse of Gaussian distribution.
Figure 7:
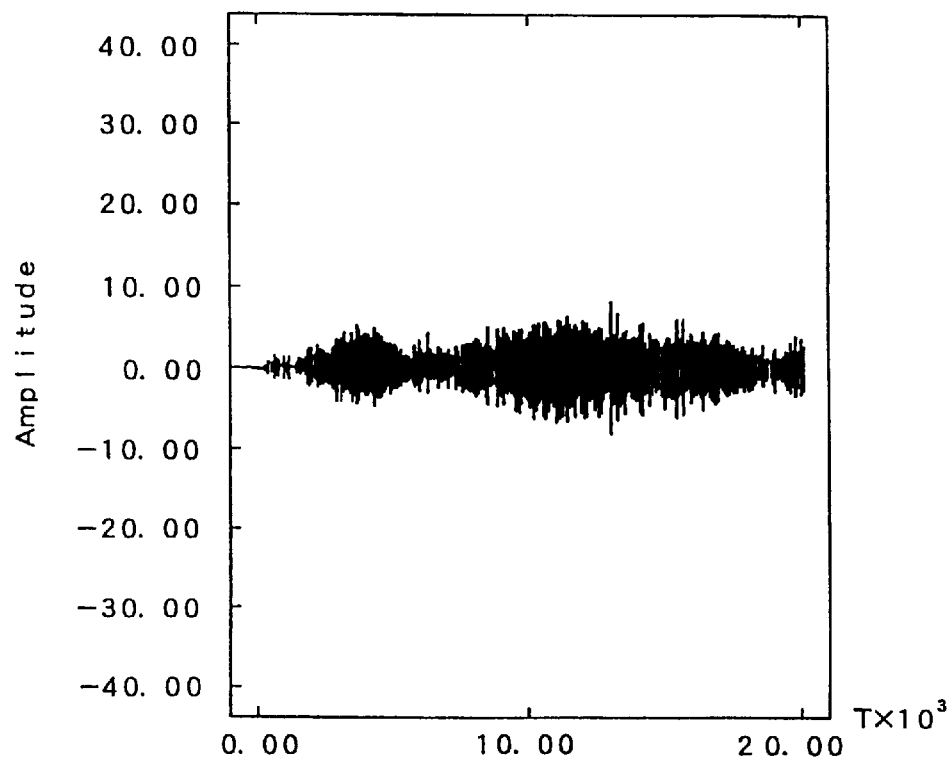
FIG. 7 shows an output signal of the time spread root Nyquist filter of the present invention when the same signal as that in FIG. 6 is input.

Even when impulse noise is generated on a transmission route, its peak can be suppressed by passing it through 3. FIGS. 6 and 7 show the output signals of the conventional root Nyquist filter, and that of the time spread root Nyquist filter of the present invention, respectively, when pulse strings whose amplitudes follow Gaussian distribution are input. As is clear by comparing FIGS. 6 and 7, this time spread root Nyquist filter outputs the received signal through decreasing its peak. Even when impulse noise is generated on the transmission route, its peak can be decreased to suppress the impulse noise if the time spread root Nyquist filter of the present invention is set at reception. This communication system resists noise well strongly.

Although the example using binary PN codes for giving phases 0 and $\pi$ according to binary values is described in the above embodiment, other values can be corresponded like 0 and $-\pi$, and $-\pi/2$ and $\pi/2$. A PN code can be a multiple value: in this case, the corresponding phases are related.

As mentioned, the time spread root Nyquist filter according to the present invention can decrease signal peak factors and suppress impulse noise on transmission route.

What is claimed is:

1. A method of transmitting and receiving a transmission data signal comprising the steps of:

generating the transmission data signal;

modulating the transmission data signal through a first time spread root Nyquist filter according to $$H_1(f)=|H(f)|e^{j\theta(f)}$$

to generate a transmission signal;

transmitting the transmission signal;

receiving the transmission signal;

transforming the transmission signal into a baseband signal; and demodulating the baseband signal through a second time spread root Nyquist filter according to $$H_2(f)=H^*_1(f)=|H(f)|e^{-j\Theta(f)}$$

to revive the transmission data signal, wherein H(f) is determined according to $$|H(f)| = \begin{cases} 1 & 0 \le |f| < (1-\alpha)/2T \\ \cos((T/4\alpha)(2\pi|f|-\pi(1-\alpha)/T) & (1-\alpha)/2T \le |f| < (1+\alpha)/2T \\ 0 & (1+\alpha)/2T \le |f| \end{cases}$$

2. The method of claim 1, wherein the first and second Nyquist filters display amplitude-frequency characteristics defining a graphical area, when |H(f)| is plotted against f, that is divided into a predetermined number, each of which is given a frequency band phase corresponding to a bit in a location in response to a pseudo noise code having a length defined by the predetermined number.

3. The method of claim 2, wherein the frequency band phase is 0 when the pseudo noise code is 1 and the frequency band phase is π when the pseudo noise code is 0.

4. The method of claim 2, wherein the predetermined number is 7.

5. A system for transmitting and receiving a transmission signal comprising:

a transmission data source that generates a transmission data signal;

a first time spread root Nyquist filter that modulates the transmission data signal according to $$H_1(f)=|H(f)|e^{j\Theta(f)}$$

to generate a transmission signal; and a second time spread root Nyquist filter that accepts the transmission signal, once it has been transformed into a baseband signal, and that demodulates the baseband signal according to $$H_2(f)=H^*_1(f)=|H(f)|e^{-j\Theta(f)}$$

to revive the transmission data signal, wherein H(f) is determined according to $$|H(f)| = \begin{cases} 1 & 0 \le |f| < (1-\alpha)/2T \\ \cos((T/4\alpha)(2\pi|f|-\pi(1-\alpha)/T) & (1-\alpha)/2T \le |f| < (1+\alpha)/2T \\ 0 & (1+\alpha)/2T \le |f| \end{cases}$$

6. The system of claim 5, wherein the first and second Nyquist filters display amplitude-frequency characteristics defining a graphical area, when |H(f)| is plotted against f, that is divided into a predetermined number, each of which is given a frequency band phase corresponding to a bit in a location in response to a pseudo noise code having a length according to the predetermined number.

7. The system of claim 6, wherein the frequency band phase is 0 when the pseudo noise code is 1 and the frequency band phase is π when the pseudo noise code is 0.

8. The system of claim 6, wherein the predetermined number is 7.

9. A method of transmitting a modified transmission data signal, comprising the steps of:

generating the transmission data signal;

modulating the transmission data signal through a time spread root Nyquist filter according to $$H_1(f)=|H(f)|e^{j\Theta(f)}$$

to generate a transmission signal; and transmitting the transmission signal, wherein H(f) is determined according to $$|H(f)| = \begin{cases} 1 & 0 \le |f| < (1-\alpha)/2T \\ \cos((T/4\alpha)(2\pi|f|-\pi(1-\alpha)/T) & (1-\alpha)/2T \le |f| < (1+\alpha)/2T \\ 0 & (1+\alpha)/2T \le |f| \end{cases}$$

10. The method of claim 9, wherein the Nyquist filter displays amplitude-frequency characteristics defining a graphical area, when |H(f)| is plotted against f, that is divide into a predetermined number, each of which is given a frequency band phase corresponding to a bit in a location in response to a pseudo noise code having a length define by the predetermined number.

11. The method of claim 10, wherein the frequency band phase is 0 when the pseudo noise code is 1 and the frequency band phase is π when the pseudo noise code is 0.

12. The method of claim 10, wherein the predetermined number is 7.

13. A method of reviving a transmission data signal from a transmission signal, comprising the steps of:

receiving the transmission signal;

transforming the transmission signal into a baseband signal; and demodulating the baseband signal through a time spread root Nyquist filter according to $$H_2(f)=H^*_1(f)=|H(f)|e^{-j\Theta(f)}$$

to revive the transmission data signal, wherein H(f) is determined according to $$|H(f)| = \begin{cases} 1 & 0 \le |f| < (1-\alpha)/2T \\ \cos((T/4\alpha)(2\pi|f|-\pi(1-\alpha)/T) & (1-\alpha)/2T \le |f| < (1+\alpha)/2T \\ 0 & (1+\alpha)/2T \le |f| \end{cases}$$

14. The method of claim 13, wherein the Nyquist filter displays amplitude-frequency characteristics defining a graphical area, when |H(f)| is plotted against f, that is divide into a predetermined number, each of which is given a frequency band phase corresponding to a bit in a location in response to a pseudo noise code having a length define by the predetermined number.

15. The method of claim 14, wherein the frequency band phase is 0 when the pseudo noise code is 1 and the frequency band phase is π when the pseudo noise code is 0.

16. The method of claim 14, wherein the predetermined number is 7.

* * * * *

UNITED STATES PATENT AND TRADEMARK OFFICE
CERTIFICATE OF CORRRECTION

PATENT NO. : 6,094,667
DATED : July 25, 2000
INVENTOR(S) : Xuping Zhou, et al.

It is certified that error appears in the above-identified patent and that said Letters Patent is hereby corrected as shown below:

Title page, under item [56] insert the following:
OTHER(Including in this order Author, Title, Periodical Name, Date, Pertinent Pages, etc.)

| |
|---|
| "A Smooth Envelope Parallel Modulation/Demodulation Scheme" p. 59 - p. 64, Shigeru TOMISATO and Hiroshi SUZUKI, Technical Report of IEICE, RCS95-77 (1995-09), The Institue of Electronics, Information and Communication Engineers |
| "Time Spreading Filter as a Impulse Noise-Combater" p. 1117- p. 1122, Xuping ZHOU, Ikuo OKA and Chikato FUJIWARA, International Symposium on Information Theory and Its Applications, Sydney, Australia, 20-24, November 1994 |

"The Performance of Channel Estimation Method Using Weighted Multi-Symbol Averaging (WMSA) with Pilot Channel in DS-CDMA", Sadayuki ABETA et al., Technical Report of IEICE, The Institute of Electronics, Information and Communication Engineers "Rayleigh Fading Compensation Method for 16QAM MODEM in Digital Land Mobile Radio Systems", p. 7 - p. 15, Seiichi SAMPEI< The Transactions of the Institute of Electronics, Information and Communication Engineers, January 1989

Signed and Sealed this

Nineteenth Day of September, 2000

Q. TODD DICKINSON

*Attest:*

*Attesting Officer*     *Director of Patents and Trademarks*

UNITED STATES PATENT AND TRADEMARK OFFICE
CERTIFICATE OF CORRECTION

PATENT NO. : 6,094,667  
DATED : July 25, 2000  
INVENTOR(S) : Zhou et al.

Page 1 of 1

It is certified that error appears in the above-identified patent and that said Letters Patent is hereby corrected as shown below:

<u>Title page,</u>
Item [30], "Foreign Application Priority Data," delete priority application number "9-011953" and insert therefor -- 9-011959 --.

Signed and Sealed this

Twenty-fifth Day of December, 2001

*Attest:*

JAMES E. ROGAN
*Attesting Officer*  *Director of the United States Patent and Trademark Office*